United States Patent [19]

Glover

[11] Patent Number: 4,700,880

[45] Date of Patent: Oct. 20, 1987

[54] PROCESS FOR MANUFACTURING ELECTRICAL EQUIPMENT UTILIZING PRINTED CIRCUIT BOARDS

[75] Inventor: Steven L. Glover, Horse Shoe, N.C.

[73] Assignee: Westinghouse Electric Corp., Pittsburgh, Pa.

[21] Appl. No.: 868,832

[22] Filed: May 29, 1986

[51] Int. Cl.⁴ .............................................. B23K 31/02
[52] U.S. Cl. .................................. 228/180.1; 29/843; 361/398
[58] Field of Search ................. 361/398, 407; 29/843, 29/842, 829, 846, 830, 411, 412, 413; 228/160, 159, 180.1

[56] References Cited

U.S. PATENT DOCUMENTS

| | | | |
|---|---|---|---|
| 2,014,524 | 9/1935 | Franz | 361/398 |
| 3,373,409 | 3/1968 | Ford | 361/398 |
| 3,780,431 | 12/1973 | Feeney | 29/830 |
| 4,066,851 | 1/1978 | White et al. | 361/398 |
| 4,343,084 | 8/1982 | Wilmarth | 29/843 |
| 4,360,144 | 11/1982 | Cuddy et al. | 228/180.1 |

Primary Examiner—Nicholas P. Godici
Assistant Examiner—Karen Skillman
Attorney, Agent, or Firm—M. J. Moran

[57] ABSTRACT

A manufacturing process is taught for building electrical equipment having two circuit boards therein which are electrically interconnected by a ribbon conductor. The process includes forming the shape of both boards on a single blank of circuit board material with the two boards juxtaposed in such a position that after the mask of the perimeter of the boards have been cut from the blank of material they still remain joined in one region. All of the elements are then disposed on the joined circuit boards including the ribbon conductor. After all the component parts, including the ribbon conductor have been disposed in place, they are soldered to the joined boards by a single wave soldering operation. After this the board are broken apart and otherwise configured for disposal in spaced apart relationship in the apparatus which they serve.

8 Claims, 11 Drawing Figures

4,700,880

PROCESS FOR MANUFACTURING ELECTRICAL EQUIPMENT UTILIZING PRINTED CIRCUIT BOARDS

CROSS-REFERENCE TO RELATED APPLICATIONS

The subject matter of this invention is related to inventions claimed and disclosed in copending, concurrently filed application Ser. No. 868,834 entitled "Master Metering Module With Voltage Selector" by D. P. Orange, J. C. Engel, G. F. Saletta, D. A. Mueller and R. T. Elms and application Ser. No. 868,833 entitled "Master Metering Module With Digital Saturation Adjuster And Method For Use Thereof" by D. P. Orange, J. C. Engel, G. F. Saletta and D. A. Mueller all of which are assigned to the assignee of the present invention.

BACKGROUND OF THE INVENTION

The subject matter of the invention is related generally to manufacturing processes for electrical equipment which utilizes circuit boards and is particularly related to manufacturing processes for mounting components on printed circuit boards, testing them and then disposing the printed circuit boards in the equipment.

Description of the Prior Art

The manufacture and use of printed circuit boards is well known in the art. A printed circuit board, for example, may comprise a phenolic or fire-retardant epoxy glass laminate insulating base upon either side of which is disposed a thin layer of copper. In accordance with a predesigned arrangement of the conducting paths on either side of the insulating base, non-conductive portions of the copper may be etched away or otherwise removed in accordance with a well known photographic-etching process. Furthermore, appropriate holes may be drilled or otherwise disposed in the base for mounting electrical components thereupon and for soldering those components to the appropriate parts of the conductive copper which remains after etching. The components may be electrically interconnected with the copper regions on the board by way of a well known wave soldering process. It is also well known to make duplicate boards on a larger piece of circuit board material and then cut the duplicate portions away for subsequent use.

It would be advantageous if a way could be found for making two different circuit boards for installation in the same piece of electrical equipment where the two different circuit boards could be joined by connectorless ribbon conductor for example for intercommunication of electrical activity between the two boards and where this could be done in a reliable, inexpensive manner and where the testing process for determining the quality of the finished product could be simplified.

SUMMARY OF THE INVENTION

In accordance with the invention, a method for manufacturing electrical apparatus of the kind which employs two separate circuit boards which are electrically interconnected is taught. The method comprises the steps of forming different but adjacent regions of a single piece of circuit board material into the general shape of the separate circuit boards with an area of jointure therebetween, disposing one end of an electrical conductor on one of the circuit boards and the other end of the electrical conductor on the other of the circuit boards. The conductors are soldered at both ends to the respective circuit boards, and the boards separated at said area of jointure after the soldering step. Thereafter, each of the separated circuit boards may be disposed in a common base. Furthermore in another embodiment of the invention, one of the circuit boards may be formed with a larger dimension than the other circuit board but where nevertheless the smaller circuit board has protrusions extending therefrom which make the smaller circuit generally equal in size to the larger circuit board in the area of the protrusions. The non-separated circuit boards may then be disposed in a common wave soldering bath for wave soldering. Because of the protrusions on the smaller board both boards are well supported in the wave soldering bath. Thereafter the joined boards are broken apart at the point of common jointure. Then the portions of the smaller circuit board which form the larger dimension can also be broken off so that the smaller circuit board is truly smaller than the larger circuit board.

BRIEF DESCRIPTION OF THE DRAWINGS

For a better understanding of the invention, reference may be had to the preferred embodiment thereof shown in the accompanying drawings in which.

DESCRIPTION OF THE PREFERRED EMBODIMENT

Figure 1:
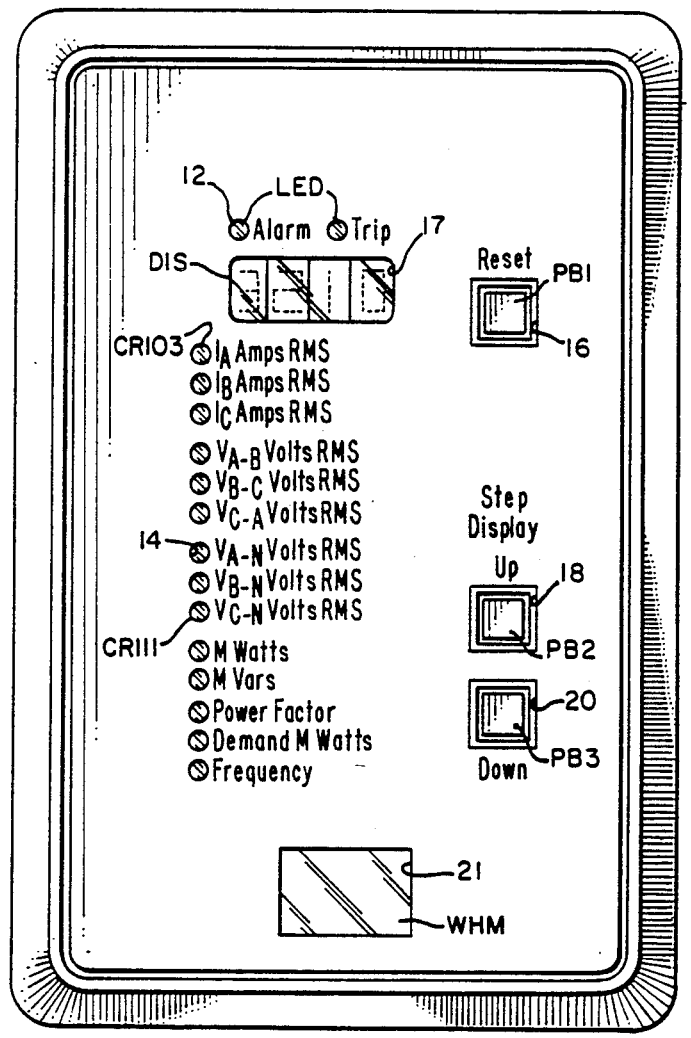
FIG. 1 shows the front panel of a master metering module, the internal portions of which utilize concepts of the present invention.

Referring now to the drawings and FIG. 1 in particular, the front panel FP for a master metering module FP is shown. The front panel 10 may comprise light-emitting diodes LED protruding through holes or openings 12 in the front panel FP. In a like manner, a display DIS may protrude through an opening 17 in the front panel FP. Also, light-emitting diodes CR103-CR116 may protrude through openings 14 arranged vertically as shown in FIG. 1 in the front panel FP. Each of the light-emitting diodes CR103-CR116 may be associated with circuit variable indicia. For example, light-emitting diode CR103 may be identified with the variable "I₄AmpsRMS". Disposed in square openings 16, 18 and 20 in front panel FP may be pushbuttons PB1, PB2 and PB3, respectively which may provide functions "Reset", "Up", and "Down", respectively. There also may be provided in an opening or hole 21 in the front panel FP a watt hour meter WHM.

Figure 2:
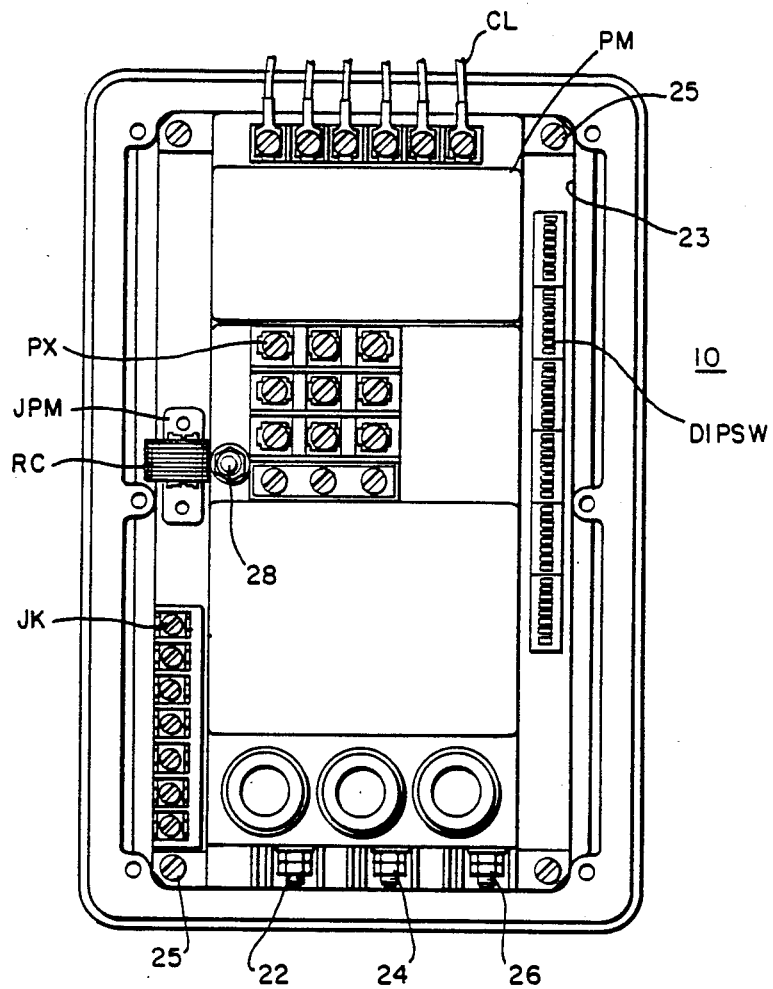
FIG. 2 shows the back of the master metering module shown in FIG. 1.

Referring now to FIG. 2, the back of the master metering module system 10 is shown. In this case, there is provided a power module PM which may include a central power transformer PX. There may be provided current leads CL and voltage leads (not shown) which are connected to terminals 22, 24 and 26 for bringing electrical voltage to the master metering panel 10 from the system to be monitored thereby. There may also be disposed in the rear of the master metering panel 10 a dip switch arrangement DIPSW, a connector arrangement JPM for interconnecting signals from the power module PM to other portions of the master metering module 10 and a set of terminals JK which are useful for providing information to various alarms and relays.

Figure 3:
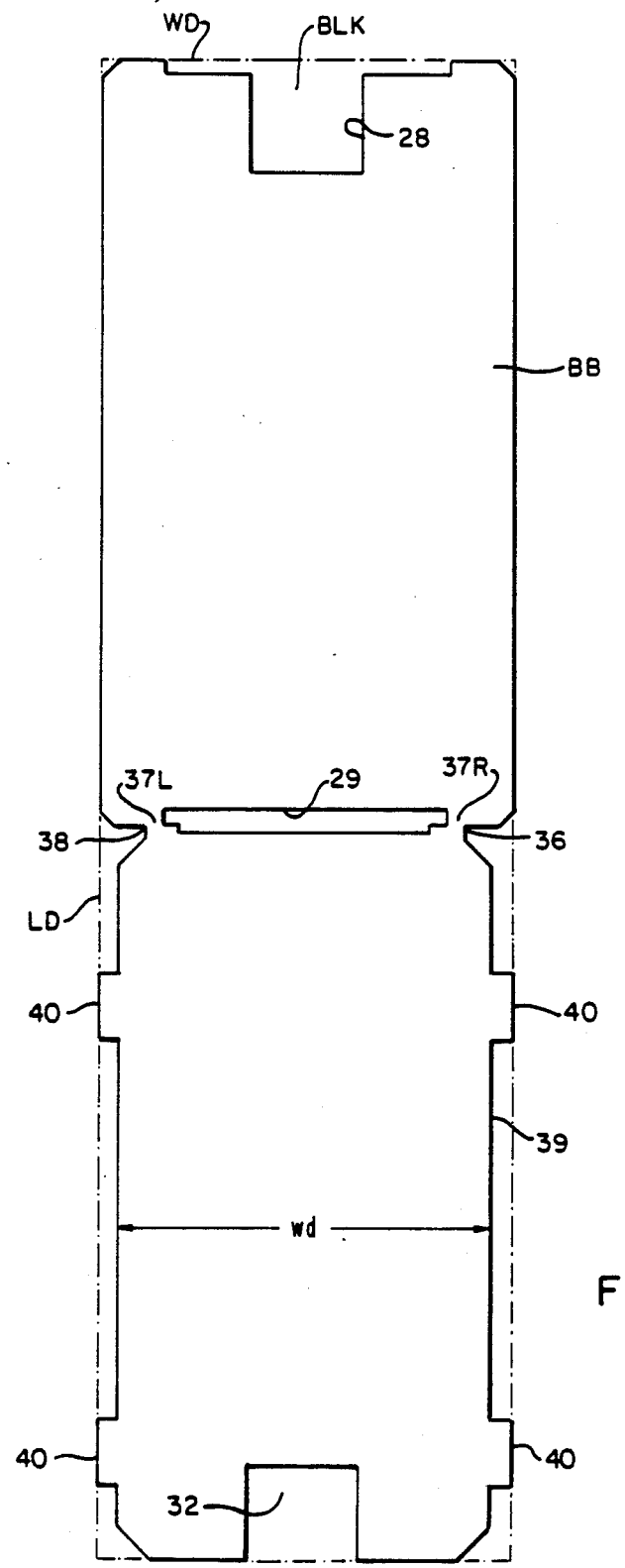
FIG. 3 shows a rectangular blank of circuit board material with the outline of two separate circuit boards shown thereon.

Referring now to FIG. 3, a method for constructing two separate circuit boards for use in the master metering module is taught. In particular, a blank BLK of circuit board material in the shape of a rectangle with a width WD and a length LD has disposed thereupon the outline of a backboard BB and a joined display board DB. The region of demarcation between the backboard BB and the display board DB is shown generally at 38. A notch 36 is provided on either side of the blank material BLK and a central opening 29 is provided therein leaving a pair of small isthmuses or necks 37R and 37L for maintaining the structural continuity between the backboard BB and the display board DB. The perimeter of the backboard BB is such that the width WD of the blank BLK is generally equal to the width of the backboard BB. In a preferred embodiment of the invention, the width of the display board DB is envisioned to be approximately equal to the dimension wd. However, four protrusions 40 are temporarily left on the display board where shown. These protrusions 40 are such that the display board DB is temporarily generally equal in width WD to the backboard BB when measured laterally in the region of the protrusions 40. Appropriate notches 28 and 32 are also cut for providing the overall shape of the backboard BB and the joined display board DB.

Figure 4:
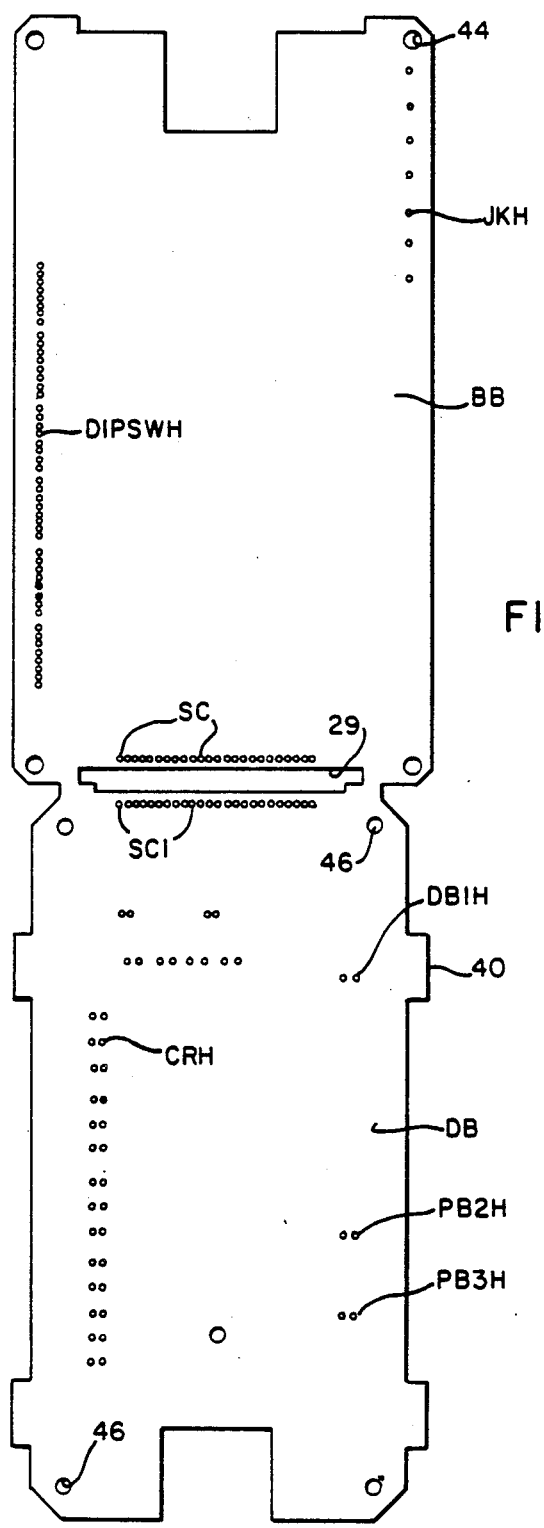
FIG. 4 shows the blank of FIG. 3 after shaping and drilling.

Referring now to FIGS. 1, 2 and 4, the outline of the joined backboard BB and display board DB after notching or cutting has taken place and after appropriate holes or openings have been placed in the notched blank are shown. For example, on the backboard BB are disposed four mounting holes 44. Also disposed in the backboard BB are holes JKH for mounting and soldering appropriate portions of the terminal members JK thereto. Holes DIPSWH for soldering connectors from the dip switches DISPW thereto are also shown. Terminal holes PB1H, PB2H and PB3H for the pushbuttons PB1, PB2 and PB3 are also shown. Holes or openings, for example CRH, for the terminals of the light-emitting diodes CR103-CR116, for example are also shown. It will be noted that on either side of the opening or cut away portion 29 are disposed a row of terminal holes SC on the backboard BB and a row of holes SC1 on the display board DB. It is into these holes that the ends of conductors in a ribbon conductor (not shown) are disposed for subsequent soldering to conductors (not shown) etched on the substrates of the backboard BB and display board DB.

Figure 5:
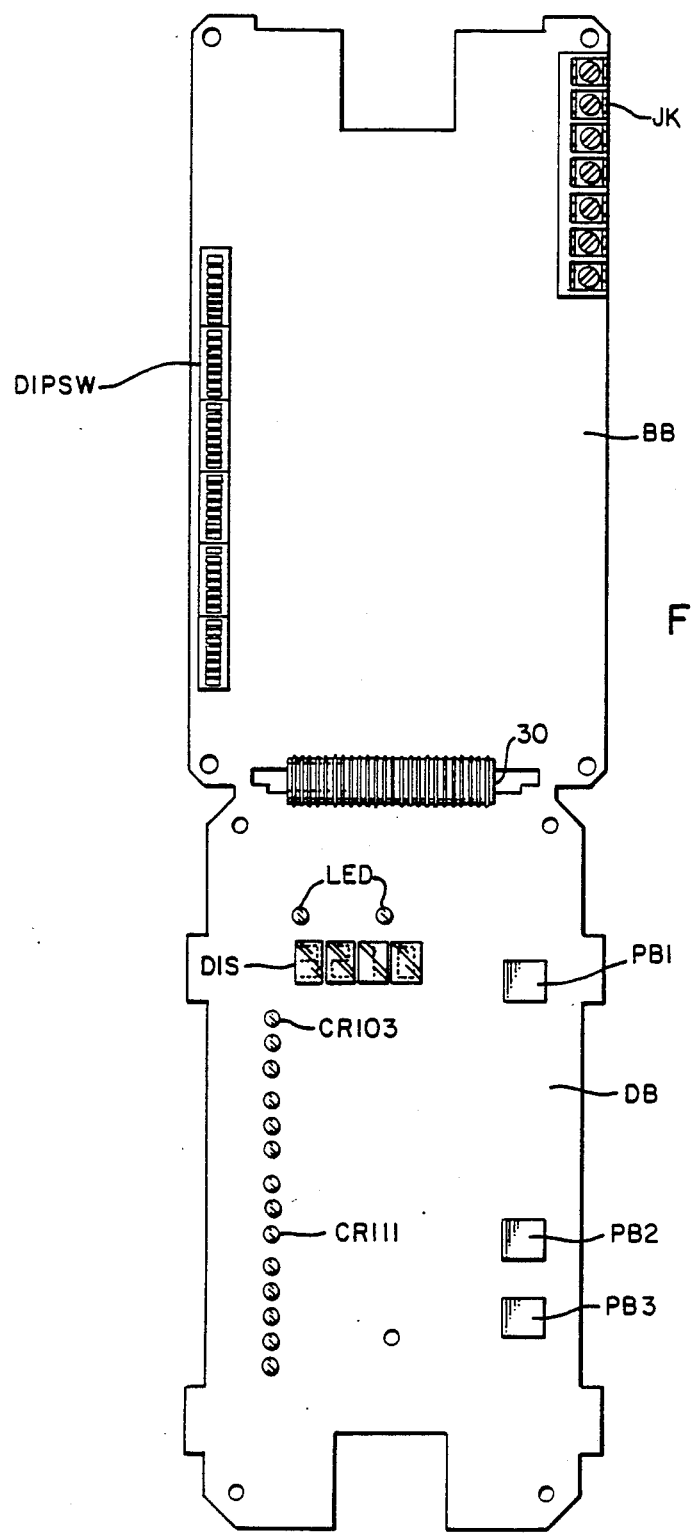
FIG. 5 shows the still-joined circuit boards of FIGS. 3 and 4 with circuit components in place.

Referring now to FIG. 5, the still joined backboard BB and display board DB are shown with various circuit elements in place. The external terminal arrangement JK and the dip switch arrangement DIPSW are shown on the backboard as well as the ribbon conductor 30. Shown on the display board DB are the light-emitting diodes LED, the light-emitting diodes CR103-CR116 inclusive, for example, and the pushbuttons PB1, PB2, PB3. In this embodiment of the invention the previously described circuit elements are fixedly mounted to the various boards and conductors therefor are disposed in the previously described holes or openings for subsequent soldering to etched copper substrate conductors on the various boards, for example, by a wave soldering technique.

Figure 6:
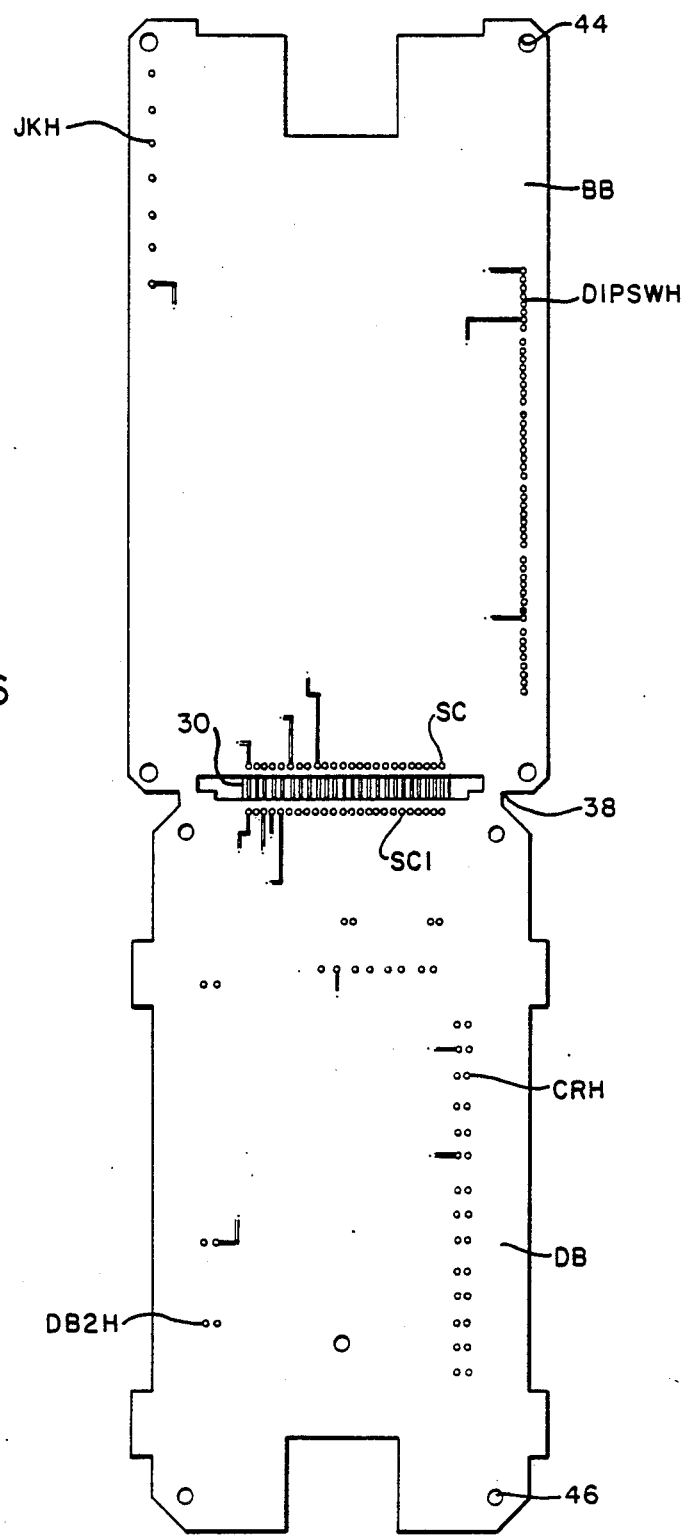
FIG. 6 shows the back of the arrangement of FIG. 5 after wave soldering with a schematic representation of some portions of the circuit board copper substrate conductor shown thereon.

Referring now to FIG. 6, the other side of the still joined backboard BB and display board DB are shown with the previously described holes into which the small conductors for the various circuit elements have been disposed for wave soldering. Illustrative, but non-limiting depictions of partial conductor paths in the copper substrate or overlay are shown in FIG. 6. Also shown are examples of the previously described openings JKH, DIPSWH, PB2H, CRH, 44 and 46. The arrangement shown in FIG. 6 may then be disposed face down in a trough of a wave soldering bath so that a wave of solder may be moved from up to down or down to up or both as depicted in FIG. 6 to solder the various terminals to the conducting substrate paths on the various boards. This has the advantage of securing the multiple conductors of the ribbon cable 30, for example, to holes or terminal openings SC and SC1 in the backboard BB and display board DB, respectively, without necessitating the utilization of expensive separate connectors. Note that if the boards were not still joined at this time this could not be conveniently done with a wave soldering apparatus as the boards would be free to move relative to one another during the wave soldering process. If the ribbon conductor 30 were soldered to the boards BB and DB after separation and after the wave soldering process had taken place for the other elements, then the hand soldering process associated with connecting the ribbon conductor 30 to the boards BB and DB at SC and SC1, respectively, could lead to the disruption of already well formed solder joints or the formation of cold solder joints and the like. Furthermore such a duplicate action would be time consuming and costly.

Figure 7:
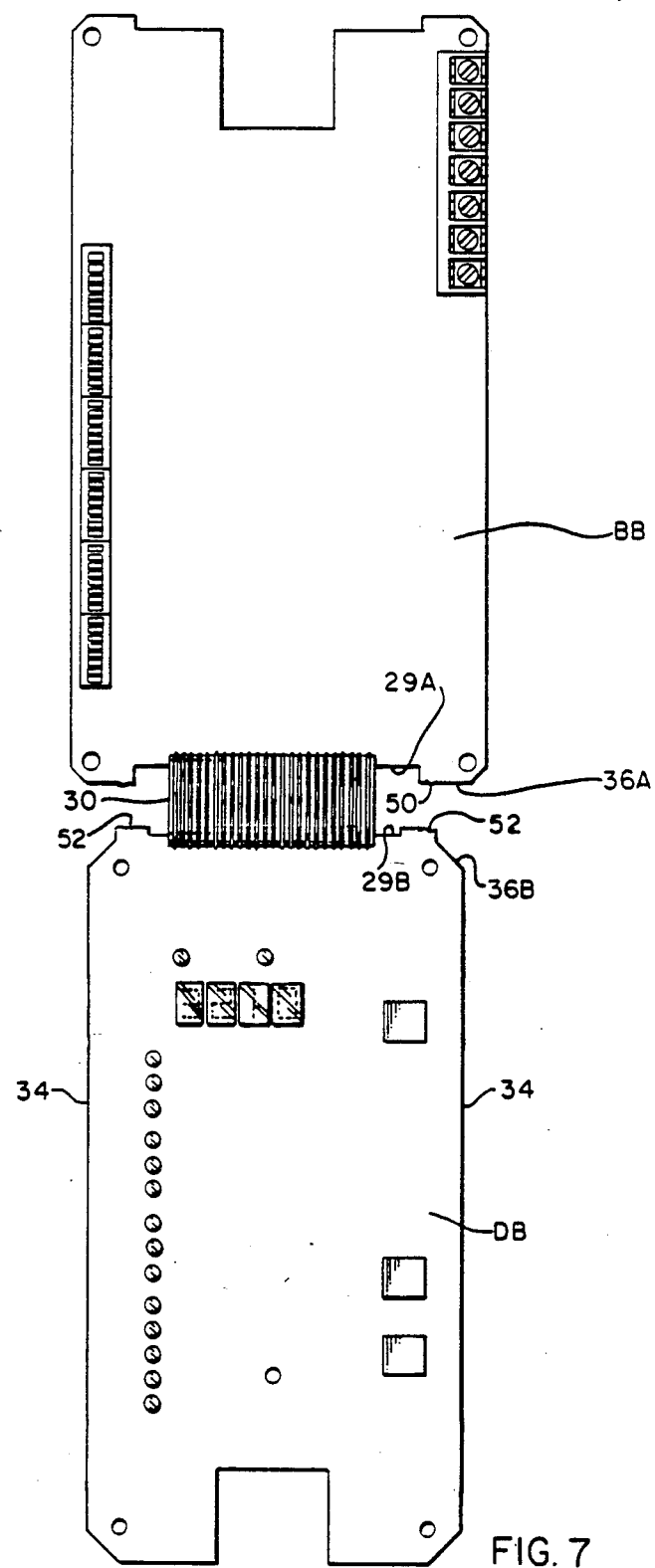
FIG. 7 shows the circuit board arrangement of previous FIGS. 3-6 after separation.

Referring now to FIG. 3 and FIG. 7, the arrangement of the backboard and the display board as viewed from the top after the wave soldering procoess has taken place, depicts a separation of the backboard BB from the display board DB so that the notch or opening regions 29 and 36 of FIG. 3 are now broken into separated regions 29A, 29B, 36A and 36B. The isthmuses or necks 37R and of FIG. 3 are broken at 52 in a convenient manner. Backboard BB and the display board DB now become two separate boards with their components in place and with the interconnecting ribbon conductor 30 in place and with all of the soldering having been accomplished in a single wave soldering operation. It will be noted that at this point the extensions or protrusions 40 have also been removed thus making the display board DB narrower in every portion along its length than the backboard BB. This has an advantage which will be discussed hereinafter.

Figure 8:
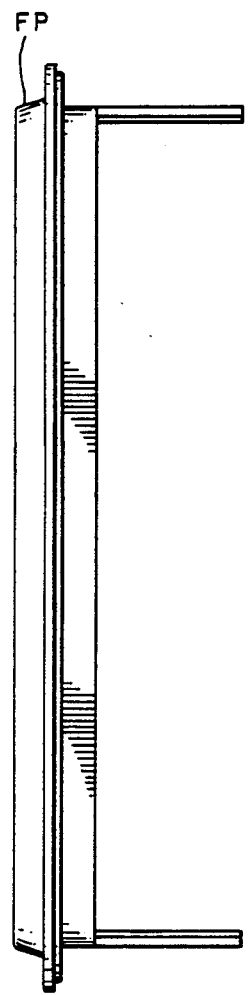
FIG. 8 shows a side view of the front panel of FIG. 1 before installation of the circuit boards.
Figure 9:
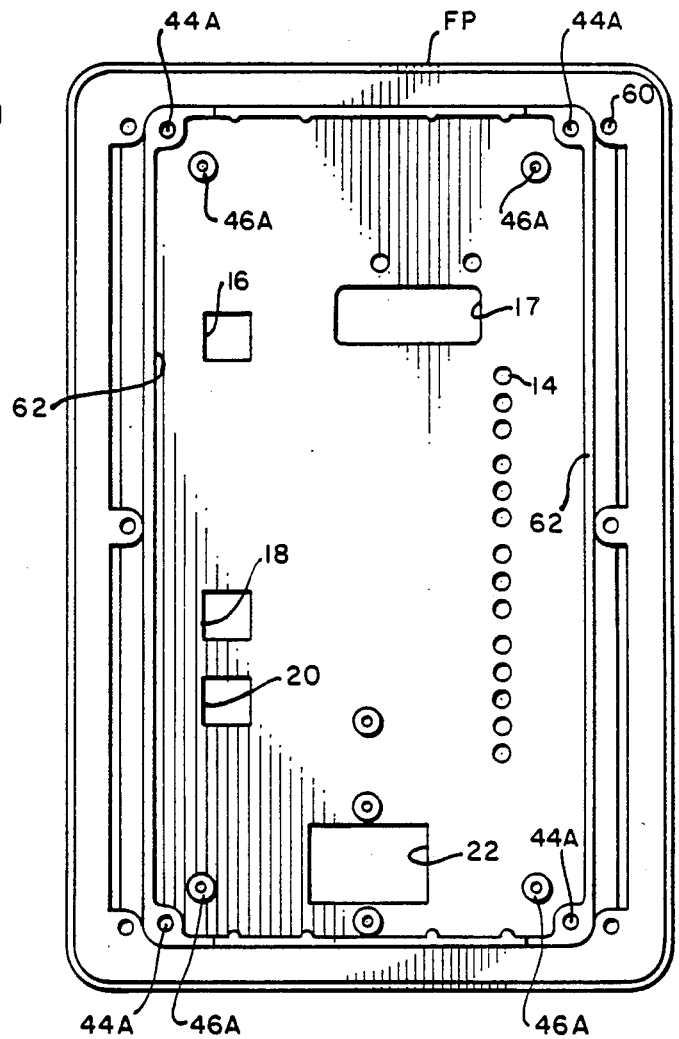
FIG. 9 shows a back view of the front panel of FIG. 1 before installation of the circuit boards.

Referring now to FIGS. 8 and 9, a side view and back view respectively of the front panel FP of FIG. 1 are shown without the circuit boards in place. The appropriate holes or openings are shown from the back portion of the front panel FP. It will be noted that there are suitable receptacles for screws or similar mounting means for both of the circuit boards. Receptacles, holes or openings 46A are provided for the display boards DB and receptacles, holes or openings 44A are provided for the wider backboard BB. The display board DB rests on stand offs around the holes or openings 46A and between rails or spacers 62 which are utilized to support the larger backboard BB and to separate the backboard BB from the display board DB so that electrical spacing between the two may be maintained.

Figure 10:
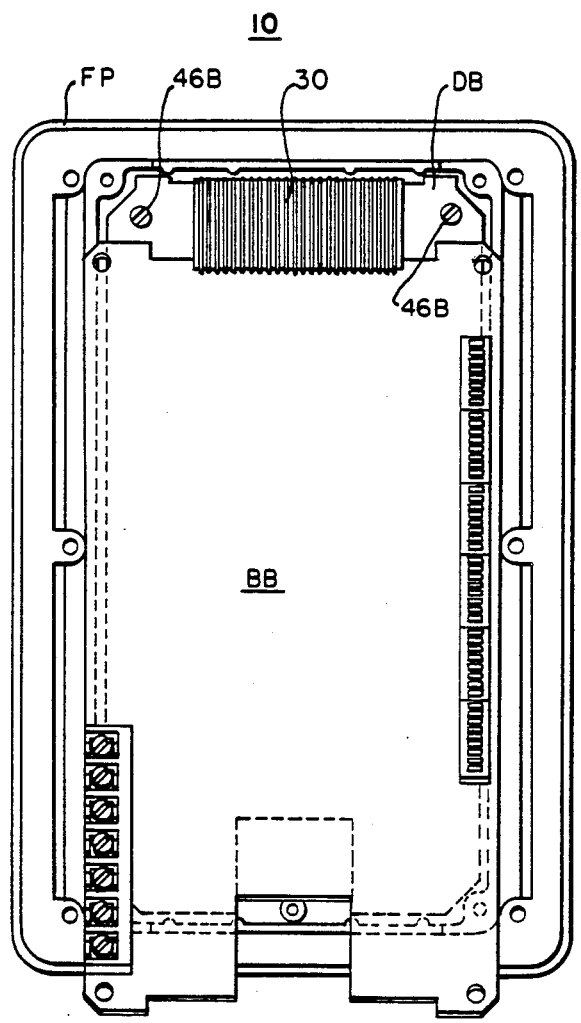
FIG. 10 shows a back view of the panel of FIG. 1 with the first or smaller circuit board in place and the larger circuit board hanging loose.

Referring now to FIGS. 4, 9 and 10, a partial assembly of the master metering module 10 is shown. In this case, the display board DB has been disposed upon its stand off supports so that the holes 46 in as shown in FIG. 4 the display board align with similar holes or openings 46A as shown in FIG. 9 on the back of the front panel FP so that fastening means such as screws 46B may securely attach the display board DB to the front panel FP.

Figure 11:
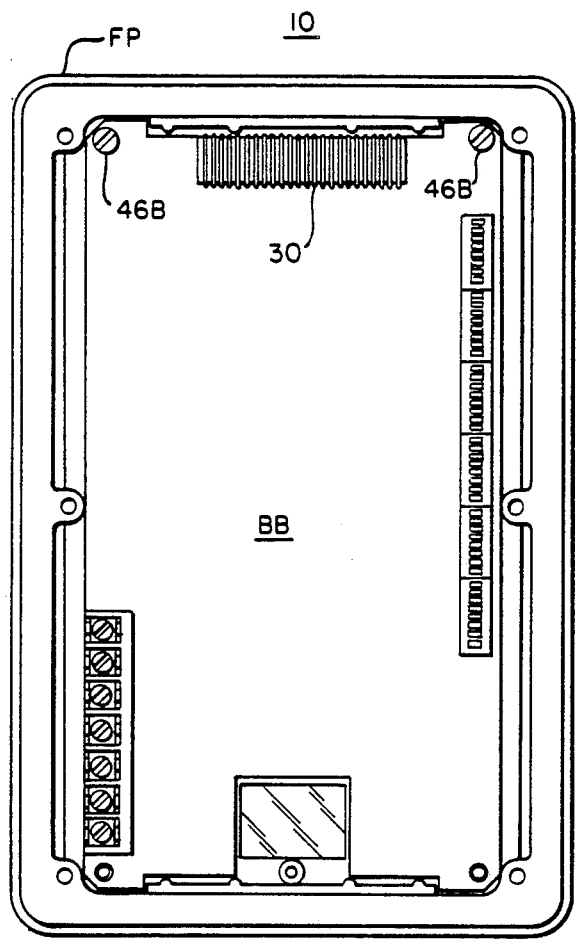
FIG. 11 shows the arrangement of FIG. 10 with the larger circuit board in place.

Referring now to FIG. 11, a further step in the completion of the assembly of the master metering module 10 is depicted in which the backboard BB is secured to the rails 62 as shown in FIG. 9 by way of screws 44B protruding through the holes 44 in the backboard BB and into threaded openings 44A (not shown) in the front panel FP. The flexible ribbon cable 30 flexes to accommodate the construction techniques for mounting the board BB and the board DB into the front panel FP.

It will be noted that by removing the protrusions 40 as shown in FIG. 3, for example, the display board DB easily fits between the rails 62 even though that board would have have fit between those rails had not the protrusions been removed. The protrusions were necessary during the construction process to allow the display board DB which was joined to the backboard BB to fit conveniently into the same trough for wave soldering. Had the protrusions not been there during the wave soldering step the board DB may have tilted into the hot solder material of the wave soldering apparatus thus rendering the apparatus useless and interfering with the wave soldering process.

The apparatus taught with respect to the embodiments of this invention have many advantages. One advantage lies in the fact that multiple printed circuit boards for use in a piece of equipment may be constructed as one piece utilizing a soldered ribbon conductor for the jointure between the two boards. The boards are then separated after the soldering operation has taken place for subsequent deployment in the apparatus that the boards are made to serve. Another advantage lies in the fact that after the construction operation has taken place, one board may be rendered smaller than the other board by breaking off protrusions which are useful in the manufacturing process so that the latter board may fit snugly between a rail which is utilized to support the larger board. This allows the smaller board to be electrically spaced from the larger board. Another advantage lies in the fact that during the testing phase, a separate test jig need not be provided for the backboard BB, for example, in which the backboard drives simulated outputs which would otherwise be found on the display board. In a like manner, the display board DB does not have to be tested separately with simulated inputs which simulate the driving signals from the backboard BB. Since both boards are constructed simultaneously with the ribbon conductor in place between them, the boards may be tested as a unit. This enhances the reliability of the test proceses, eliminates test steps, and eliminates manufacturing steps. If this were not the case, the backboard would have to be tested separately, the display board would have to be tested separately and then both boards would have to be tested separately once again after the ribbon conductor 30 was somehow installed if for no other reason than the installation process for the ribbon connector 30 may in fact effect the quality of the boards upon which it is subsequently disposed. Furthermore, this effect is not readily determinable without initiating a third testing process.

It is to be understood with respect to the embodiments of this invention that the teachings herein are not limited for use in the master metering module nor are the number of elements or components as shown in the preferred embodiment of the invention limiting. The number of holes, openings, grooves and cut outs are not limiting. Furthermore, the place where the two boards are broken apart, those shown as jagged in the illustrative example, may in fact be smoothly cut apart with the finished product having no jagged edges.

What I claim as my invention is:

1. A method for manufacturing electrical apparatus of the kind which employs two separate circuit boards which are electrically interconnected, comprising the steps of:

forming portions of a single piece of circuit board material into the general shape of both of said separate circuit boards with an area of jointure therebetween;

disposing one end of an electrical conductor on one of said joined circuit boards and the other end of said electrical conductor on the other of said joined circuit boards;

soldering said electrical conductor at both ends thereof to said joined circuit boards; and separating said joined boards at said area of jointure after said soldering step while maintaining electrical interconnection between said boards through said conductors.

2. The method as claimed in claim 1 comprising the step of disposing each of said separated circuit boards in a common base after separation thereof.

3. The method as claimed in claim 1 comprising the step of disposing a solder hole in each of said joined circuit boards and disposing said electrical conductors therein for said subsequent soldering step.

4. The method as claimed in claim 1 wherein said forming step comprises generally forming one terminal board with a larger dimension that said other terminal board, said method additionally comprising the step of forming said other terminal board with a corresponding limited portion thereof which equals said larger dimension of said one terminal board so that both boards are equally supportable in wave soldering apparatus, wave soldering said terminal boards, said method additionally comprising the step of removing said corresponding limited portion after said wave soldering step.

5. A method for manufacturing electrical apparatus of the kind which employs two separate circuit boards of different lateral dimensions which are electrically interconnected with each other, comprising the steps of:

forming on a single piece of circuit board material the outline of both said circuit boards with an area of longitudinal jointure therebetween, said circuit board of smaller lateral dimension having a protruding tab portion thereon which makes the overall lateral dimension of said smaller circuit board equal to the overall lateral dimension of said larger circuit board at one region of said smaller circuit board;

disposing a solder hole on each of said joined circuit boards;

disposing one end of an electrical conductor into one of said solder holes and the other end of said electrical conductor into the other of said solder holes;

disposing said circuit board material into a wave soldering apparatus so that both said joined circuit boards are supported therein;

wave soldering said circuit board material;

removing said circuit board material from said wave soldering apparatus; and separating said joined boards at said area of longitudinal jointure after said soldering step while maintaining electrical interconnection between said boards through said conductors.

6. The method as claimed in claim 5 comprising the additional step of disposing each of said separated circuit boards in a common base after separation thereof.

7. A method for manufacturing electrical apparatus of the kind which employs two separate circuit boards of different lateral dimensions which are electrically interconnected with each other, comprising the steps of:

forming on a single piece of circuit board material the outline of both said circuit boards with an area of longitudinal jointure therebetween, said circuit board of smaller lateral dimension having a protruding tab portion thereon which makes the overall lateral dimension of said smaller circuit board equal to the overall lateral dimension of said larger circuit board at one region of said smaller circuit board;

disposing a solder hole on one of said joined circuit boards;

disposing one end of an electrical conductor into said solder hole the other end of said electrical conductor being electrically interconnected to said other board;

disposing said circuit board material into a wave soldering apparatus so that both said joined circuit boards are supported therein;

wave soldering said circuit board material;

removing said circuit board material from said wave soldering apparatus; and separating said joined boards at said area of longitudinal jointure after said soldering step while maintaining electrical interconnection between said boards through said conductors.

8. The method as claimed in claim 5 comprising the additional step of disposing each of said separated circuit boards in a common base after separation thereof.

* * * * *